(12) United States Patent
Park et al.

(10) Patent No.: US 8,211,322 B2
(45) Date of Patent: Jul. 3, 2012

(54) METHOD OF FORMING A METAL LAYER PATTERN HAVING A NANOGAP AND METHOD OF MANUFACTURING A MOLECULE-SIZED DEVICE USING THE SAME

(75) Inventors: Dong-Gun Park, Seongnam-si (KR); Dong-Won Kim, Seongnam-si (KR); Sung-Young Lee, Yongin-si (KR); Yang-Kyu Choi, Yongin-si (KR); Chang-Hoon Kim, Yongin-si (KR); Ju-Hyun Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1099 days.

(21) Appl. No.: 12/149,388

(22) Filed: Apr. 30, 2008

(65) Prior Publication Data

US 2008/0302760 A1 Dec. 11, 2008

(30) Foreign Application Priority Data

Apr. 30, 2007 (KR) .................. 10-2007-0042129

(51) Int. Cl.
*C23F 1/00* (2006.01)
(52) U.S. Cl. ......... 216/66; 216/17; 216/57; 156/345.39; 438/181; 438/275; 438/22; 438/712; 428/810
(58) Field of Classification Search .............. 216/17, 216/57; 219/121.2; 156/345.39; 438/181, 438/275, 22, 712; 378/35; 360/327.31, 125.47; 430/321; 428/810; 204/192.34; 250/251
See application file for complete search history.

(56) References Cited

U.S. PATENT DOCUMENTS

| | | | |
|---|---|---|---|
| 3,860,783 A * | 1/1975 | Schmidt et al. ............ | 219/121.2 |
| 4,117,301 A * | 9/1978 | Goel et al. .................. | 219/121.2 |
| 5,525,542 A * | 6/1996 | Maniar et al. ................ | 438/669 |
| 6,873,007 B2 | 3/2005 | Sugita et al. | |
| 7,056,446 B2 | 6/2006 | Nagase et al. | |
| 2004/0195563 A1* | 10/2004 | Bao et al. ........................ | 257/40 |
| 2005/0121728 A1* | 6/2005 | Bao .............................. | 257/369 |
| 2006/0154400 A1 | 7/2006 | Choi et al. | |
| 2006/0270212 A1 | 11/2006 | Jung et al. | |

FOREIGN PATENT DOCUMENTS

| | | |
|---|---|---|
| JP | 08-064700 | 3/1996 |
| JP | 2004-247203 | 9/2004 |
| JP | 2006-245023 | 9/2006 |
| KR | 10-2006-0081858 A | 7/2006 |

\* cited by examiner

*Primary Examiner* — Duy Deo
*Assistant Examiner* — Erin Flanagan
(74) *Attorney, Agent, or Firm* — Lee & Morse, P.C.

(57) ABSTRACT

A method of patterning a metal layer includes forming a first mask on a surface of the metal layer, the first mask having an opening through the first mask that exposes the metal layer, and forming a nanogap in the exposed metal layer using an ion beam directed through the opening. The first mask limits a lateral extent of the ion beam, and the nanogap has a width that is less than a width of the opening.

12 Claims, 8 Drawing Sheets

METHOD OF FORMING A METAL LAYER PATTERN HAVING A NANOGAP AND METHOD OF MANUFACTURING A MOLECULE-SIZED DEVICE USING THE SAME

BACKGROUND OF THE INVENTION

1. Field of the Invention

Embodiments relate to a method of forming a metal layer pattern having a nanogap and a method of manufacturing a molecule-sized device using the same.

2. Description of the Related Art

A molecule-sized device may use a molecule as a channel. To form the channel, a nano-sized gap i.e., a nanogap having a dimension of about one to several tens of nanometers and corresponding to a length of the molecule, may be formed between a pair of metal electrodes, e.g., electrodes functioning as source and drain regions of a field-effect transistor (FET). The nanogap may be very useful for, e.g., manufacturing a molecule-sized semiconductor device, such as a petabit memory, or a biosensor.

The ability to extend existing lithographic semiconductor manufacturing processes is limited by factors such as the wavelength of light, light dispersion, the numerical apertures (NA) of lenses, the need for suitable photoresists, etc. Moreover, the use of existing lithographic processes at the limits of their applicable ranges may result in poor reproducibility of the resulting structures. Thus, there is a need for new methods of forming a nanogap and a molecule-sized device using the same.

SUMMARY OF THE INVENTION

Embodiments are therefore directed to a method of forming a metal layer pattern having a nanogap and a method of manufacturing a molecule-sized device using the same, which substantially overcome one or more of the problems due to the limitations and disadvantages of the related art.

It is therefore a feature of an embodiment to provide a method of forming a metal layer pattern having a nanogap and a method of manufacturing a molecule-sized device using the same, in which the nanogap may have a width less than that provided by a lithographic process.

It is therefore another feature of an embodiment to provide a method of forming a metal layer pattern having a nanogap and a method of manufacturing a molecule-sized device using the same, in which a width of the nanogap may be determined by controlling an ion beam angle and/or an aspect ratio of a mask.

At least one of the above and other features and advantages may be realized by providing a method of patterning a metal layer, including forming a first mask on a surface of the metal layer, the first mask having an opening through the first mask that exposes the metal layer, and forming a nanogap in the exposed metal layer using an ion beam directed through the opening. The first mask may limit a lateral extent of the ion beam, and the nanogap may have a width that is less than a width of the opening.

The ion beam may be incident on the metal layer at an angle with respect to a sidewall of the opening so that a lateral portion of the ion beam is blocked by portions of the first mask adjacent to the sidewall of the opening. The ion beam may be incident on the metal layer at an angle of about 30° to about 50° with respect to the sidewall of the opening. The sidewall of the opening may be perpendicular to a top surface of the metal layer. A first lateral extent of the nanogap may be defined by using a top surface of the first mask adjacent to the opening to limit a first lateral portion of the ion beam, and a second lateral extent of the nanogap may be defined by using a bottom sidewall of the opening to limit a second lateral portion of the ion beam.

The nanogap may be formed in an exposed surface of the metal layer, and the ion beam may be oriented at an angle with respect to the exposed surface of the metal layer. A sidewall of the opening may be angled with respect to a top surface of the metal layer, and the ion beam may be vertically incident on the top surface of the metal layer. Forming the first mask on the surface of the metal layer may include sequentially forming a first mask layer and a second mask layer on the metal layer, forming a second mask on the first mask layer using a photolithography process to pattern the second mask layer, and forming the first mask on the metal layer using an etching process to pattern the first mask layer, the second mask serving as an etching mask. The etching process may include a high-density plasma etching process, a reactive ion etching process, or a wet etching process.

At least one of the above and other features and advantages may also be realized by providing a method of manufacturing a molecule-sized device, including forming a first mask on a surface of a metal layer, the first mask having an opening through the first mask that exposes the metal layer, forming a nanogap in the exposed metal layer using an ion beam directed through the opening, and forming a gate electrode adjacent to the metal layer, the gate electrode being spaced apart from the metal layer by an insulation layer. The first mask may limit a lateral extent of the ion beam, and the nanogap may have a width that is less than a width of the opening.

The method may further include adsorbing a conductive molecular material into the nanogap. The gate electrode may be formed on a substrate, and the gate electrode may be formed between the metal layer and the substrate. The metal layer may be formed on a substrate, and the metal layer may be formed between the gate electrode and the substrate.

The ion beam may be incident on the metal layer at an angle with respect to a sidewall of the opening so that a lateral portion of the ion beam is blocked by portions of the first mask adjacent to the sidewall of the opening. The ion beam may be incident on the metal layer at an angle of about 30° to about 50° with respect to the sidewall of the opening. The sidewall of the opening may be perpendicular to a top surface of the metal layer. A first lateral extent of the nanogap may be defined by using a top surface of the first mask adjacent to the opening to limit a first lateral portion of the ion beam, and a second lateral extent of the nanogap may be defined by using a bottom sidewall of the opening to limit a second lateral portion of the ion beam.

The nanogap may be formed in an exposed surface of the metal layer, and the ion beam may be oriented at an angle with respect to the exposed surface of the metal layer. A sidewall of the opening may be angled with respect to a top surface of the metal layer, and the ion beam may be vertically incident on the top surface of the metal layer. Forming the first mask on the surface of the metal layer may include sequentially forming a first mask layer and a second mask layer on the metal layer, forming a second mask on the first mask layer using a photolithography process to pattern the second mask layer, and forming the first mask on the metal layer using an etching process to pattern the first mask layer, the second mask serving as an etching mask.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1:
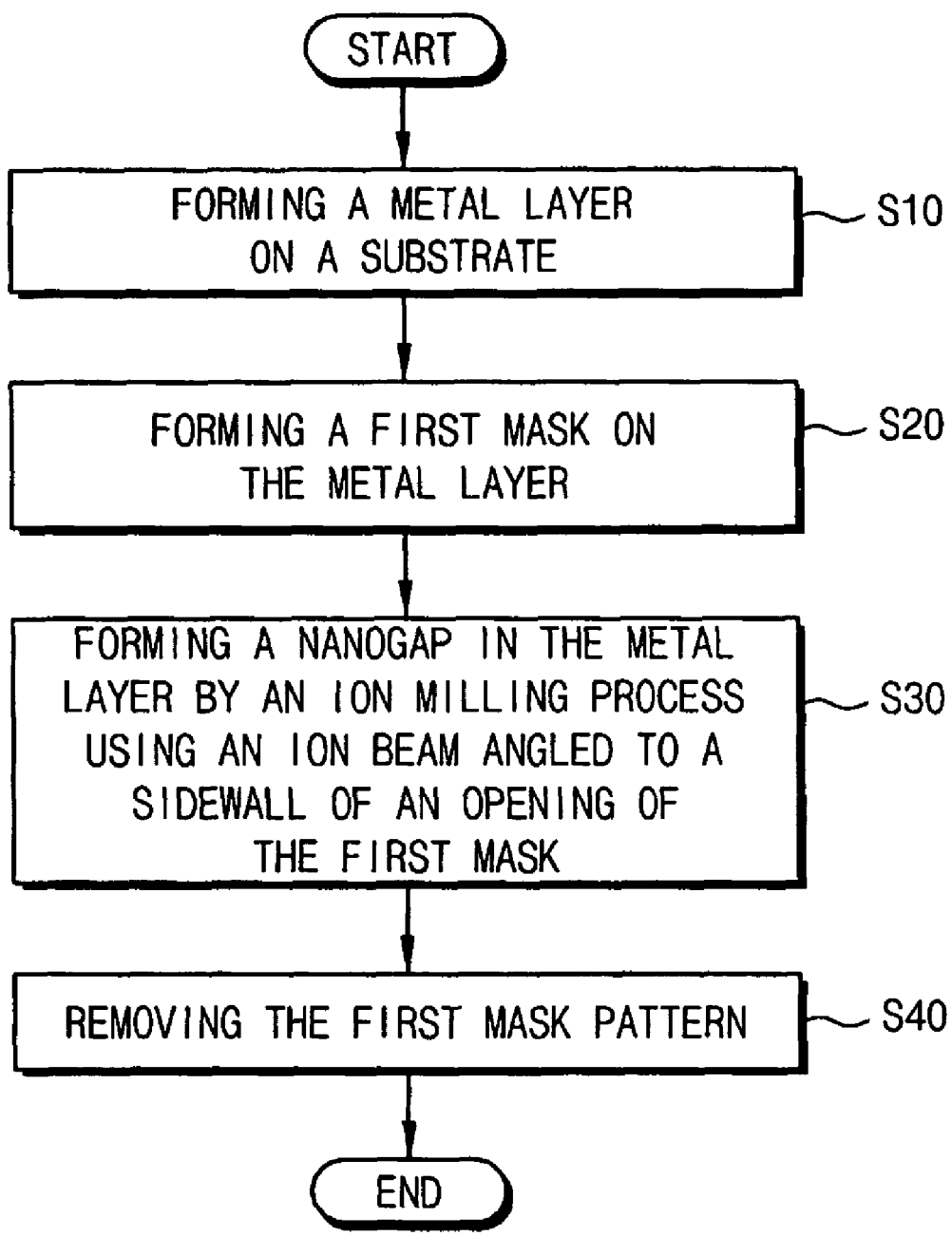
FIG. 1 illustrates a flowchart of a method of forming a metal layer pattern having a nanogap in accordance with an embodiment.

Korean Patent Application No. 10-2007-0042129, filed on Apr. 30, 2007, in the Korean Intellectual Property Office, and entitled: "Method of Forming a Metal Layer Pattern Having a Nanogap and Method of Manufacturing a Molecule-Sized Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a metal" may represent a single material, e.g., gold, or multiple materials in combination, e.g., gold mixed or alloyed with platinum.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming a Metal Layer Pattern Having a Nanogap

According to an embodiment, a method of forming a metal layer pattern may include forming a metal layer on a substrate and forming a mask having an opening on the metal layer. A nanogap may be formed in the metal layer by an ion milling process. The ion milling process may use ion beam incident on the metal layer at an angle with respect to a sidewall of the opening so that a portion of the ion beam is blocked by portions of the mask adjacent to the sidewall of the opening. The angle of the ion beam with respect to the sidewall of the opening may be adjusted, and the sidewall of the opening may also have various angles with respect to a top surface of the metal layer. Thus, a nanogap having a desired size or a desired shape may be easily formed in the metal layer.

Additionally, a molecule-sized device having a desired a gate length may be easily manufactured by forming a metal layer pattern having the nanogap. The molecule-sized device may serve as a biosensor for detecting biological material by putting a solution having conductive organic molecules into contact with the nanogap. A biosensor is a detector that detects specific materials in a living organism, e.g., materials such as enzymes, antibodies, nucleic acids, etc. The biosensor may use electrical methods, chemical methods, or optical methods for detecting the specific materials. A biosensor using the electrical method for detecting the specific materials has an advantage in that a small quantity of a specific material may be rapidly detected. Additionally, the biosensor using the electrical method may be portable because a sensing circuit and a detection circuit may be simultaneously formed. Furthermore, the biosensor may be manufactured at a low cost because the biosensor may be manufactured by mass production.

A specific material may be detected by detecting changes in electrical characteristics of both ends of a nanogap after putting a solution including biological material into contact with the nanogap, and thus the nanogap having a width of several nanometers can be used as an electrical sensor. In order to manufacture a biosensor, a nanogap, e.g., a gap having a width of several nanometers, may be required. Also, as the width of the nanogap becomes narrower, the sensitivity of the biosensor including the nanogap may increase and more efficient detection may be possible.

FIG. 1 illustrates a flowchart of a method of forming a metal layer pattern having a nanogap in accordance with the example embodiments described herein. Referring to FIG. 1, in operation S10, a metal layer may be formed on a substrate, e.g., a semiconductor substrate. The metal layer may serve as a channel in a molecule-sized device or a biosensor for detecting biological material using changes in electrical characteristics.

The metal layer may be formed from a conductive material such as a metal, a metal alloy, etc. The metal layer may be formed from a metal having a work function that is suitable for a channel in a molecule-sized device. Also, the metal layer may be formed from a metal having good adhesion to biological material to be detected when the metal layer is used as a biosensor. For example, the metal layer may be formed using gold (Au), platinum (Pt), or an alloy of these materials. In an implementation, the metal layer may be formed from gold (Au).

In operation S20, a first mask having an opening may be formed on the metal layer. The first mask may serve as an etching mask for forming the nanogap in the metal layer using an ion milling process. Forming the first mask having the opening may include forming a first mask layer on the metal layer, and then forming a second mask layer on the first mask layer. The first mask layer may be formed using a nitride such as silicon nitride. The first mask layer may have a thickness sufficient to prevent the first mask layer from being overetched by the ion milling process. The second mask layer may be formed from a material having a high etching selectivity with respect to the first mask layer.

A photoresist pattern may be formed on the second mask layer, e.g., by applying a photoresist layer, selectively exposing portions of the photoresist layer to radiation, e.g., UV light, and developing the exposed photoresist layer to yield the photoresist pattern. The photoresist pattern may have an opening therein corresponding to an opening to be formed in the second mask layer. The second mask layer may be partially removed using an etching process in which the photoresist pattern serves as an etching mask. The etching process may form a second mask from the second mask layer.

Subsequently, the first mask layer may be selectively removed using an etching process, in which the second mask pattern serves as an etching mask. Thus, the first mask partially covering and partially exposing the metal layer may be formed. The etching process used to pattern the first mask layer may include a dry etching process, a wet etching process, a reactive ion etching (RIE) process, or a high-density plasma etching process. After forming the first mask, the second mask may be removed from the first mask. An opening formed in the first mask may have a width that is determined by the resolution of the lithographic process used to pattern the photoresist, the second mask layer and the first mask layer.

In operation S30, an ion milling process may be used to form the nanogap. The ion milling process may include directing an ion beam at the metal layer through the opening in the first mask. The ion beam may remove metal from the metal layer to form the nanogap.

The ion beam may be incident on the metal layer at an angle with respect to a sidewall of the opening in the first mask. The lateral extent of the ion beam may be limited, e.g., by partially blocking the ion beam, by portions of the first mask adjacent to the opening therein. That is, the ion beam may have a width (measured parallel to the top surface of the first mask) that is greater than the width of the opening in the first mask (also measured parallel to the top surface of the first mask), and the width of the ion beam may be limited by the peripheral portions of the opening in the first mask. Limiting the lateral extent of the ion beam may limit the width of the nanogap. For a given width of the opening in the first mask, increasing the angle of the ion beam effectively reduces the aperture through which the ion beam must pass to etch the metal layer. Accordingly, the nanogap may have a width that is less than that of the first opening (both widths being measured parallel to the top surface of the first mask).

A nanogap having a desired size or a desired shape may be formed by adjusting the angle of the ion beam. During formation of the nanogap, however, the angle of the ion beam may be maintained constant. In an example embodiment, the angle with respect to a vertical sidewall of the opening may have a value of about 30° to about 50°. The ion beam may have an angle with respect to the horizontal top surface of the first mask of about 60° to about 40°.

When a nanogap having sidewalls disposed an angle with respect to a top surface of the metal layer is to be formed, the first mask may be formed so that the sidewall of the opening is perpendicular to the top surface of the metal layer, and an ion beam may be incident on the metal layer at the angle. In another implementation, when a nanogap having sidewalls disposed perpendicular to the top surface of the metal layer is to be formed, the first mask may be formed so that the sidewalls of the opening have an angle with respect to a top surface of the metal layer, and an ion beam may be incident on the metal layer at a right angle. Thus, the metal layer may have a nanogap with a desired width formed therein using an ion milling process, in which the ion beam is incident on the metal layer at an angle with respect to the sidewall of the opening.

In operation S40, the first mask may be removed from the metal layer, e.g., using an etching process such as a wet etching process or a dry etching process, to yield an exposed metal layer having a nanogap with a desired size and/or shape. The nanogap may be formed in the metal layer by partially blocking the ion beam from impinging on the metal layer, e.g., by adjusting an angle of the ion beam, and/or adjusting a width, height (with height/width being the aspect ratio) or sidewall profile of the opening in the first mask. Thus, a molecule-sized device or a biosensor including a nanogap having substantially the same size as a material to be detected may be easily manufactured.

Embodiment 1

Figure 2:
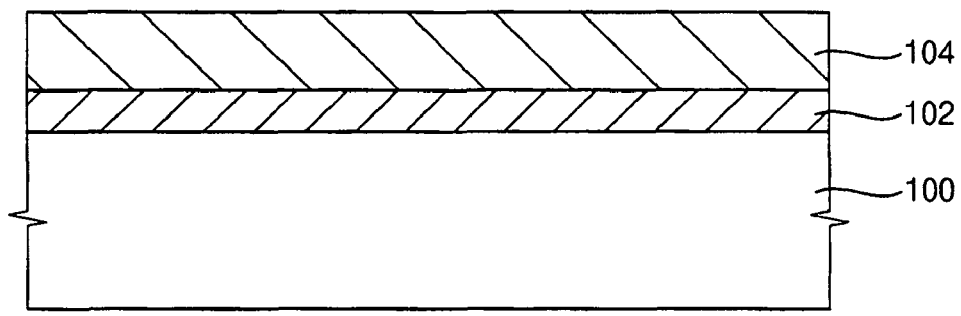
FIGS. 2 to 5 illustrate cross-sectional views of stages in a method of forming a metal layer having a nanogap in accordance with a first example embodiment.

FIGS. 2 to 5 illustrate cross-sectional views of stages in a method of forming a metal layer having a nanogap for a molecule-sized device or a biosensor in accordance with a first example embodiment. Referring to FIG. 2, an insulation layer 102 and a metal layer 104 may be sequentially formed on a substrate 100. The substrate 100 may include, e.g., semiconductor substrate such as a silicon substrate, a germanium substrate, a silicon-on-insulator (SOI) substrate or a germanium-on-insulator (GOI) substrate. In other implementations, the substrate 100 may be a non-semiconductor substrate.

The insulation layer 102 may be formed from, e.g., silicon oxide, silicon-on-glass (SOG), silicon nitride, silicon oxynitride, or a high-k dielectric material such as $Al_2O_3$, $Hf_2O_3$, etc. The insulation layer 102 may be formed by a thermal oxidation process, a chemical vapor deposition (CVD) process, a plasma-enhanced chemical vapor deposition (PECVD) process, an atomic layer deposition (ALD) process, etc. For example, a silicon oxide layer may be formed by a thermal oxidation process, and a silicon oxynitride layer may be formed by nitriding the silicon oxide layer.

The metal layer 104 may be formed from a conductive material, e.g., a metal, a metal alloy, etc. For example, the metal layer 104 may be formed from gold (Au), silver (Ag), platinum (Pt), or an alloy of these materials. In an implementation, the metal layer 104 may be formed from gold (Au).

Figure 3:
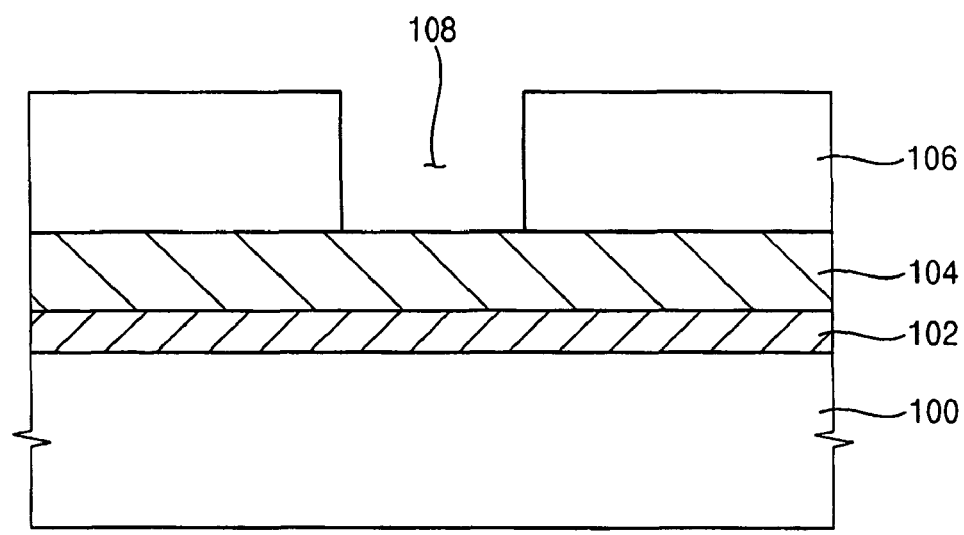

Referring to FIG. 3, a first mask 106 having a first opening 108 may be formed on the metal layer 104. Sidewalls of the first opening 108 may be perpendicular to a top surface of the metal layer 104. The first mask 106 may serve as an etching mask for forming a nanogap in the metal layer 104 using an ion milling process.

Forming the first mask 106 and the first opening 108 may include forming a first mask layer (not shown) on the metal layer 104. The first mask layer may be formed to have a thickness that is great enough to prevent the first mask layer from being etched by the ion milling process that is used to form the nanogap. Patterning the first mask layer may include forming a second mask layer (not shown) on the first mask layer, e.g. using a material having a high etching selectivity with respect to the first mask layer. A photoresist pattern (not shown) may be formed on the second mask layer, and the second mask layer may be partially removed, e.g., using an etching process, with the photoresist pattern serving as an etching mask. Thus, the second mask may be formed at a lithographic resolution. The first mask layer may then be partially removed, e.g., using an etching process, with the second mask serving as an etching mask. The first mask layer may be patterned to form the first mask 106 having the first opening 108, in which the sidewalls may be perpendicular to the top surface of the metal layer 104. The etching process used to form the first mask 106 may include a dry etching process, a wet etching process, an RIE process, or a high-density plasma etching process. The second mask may be removed after forming the first mask 106 to yield the structure illustrated in FIG. 3. A minimum width of the opening 108 may be determined by the limits of the lithography process used to pattern the photoresist.

Figure 4:
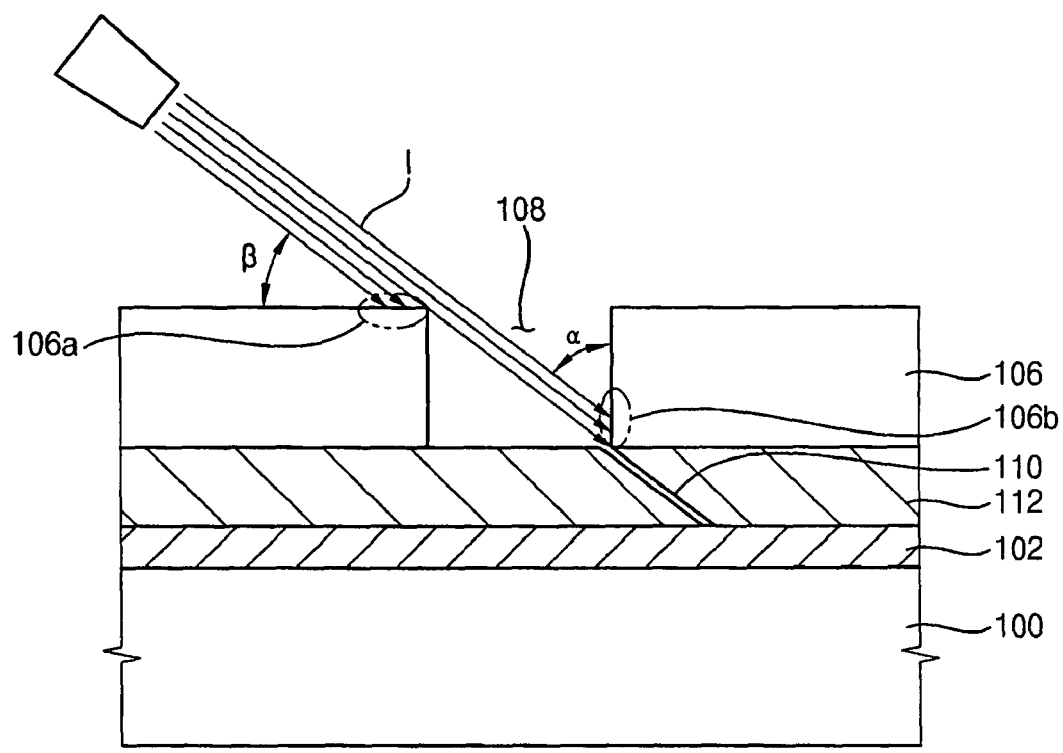

Referring to FIG. 4, an ion milling process may be performed to form a nanogap 110. The nanogap 110 may have a width of a sub-lithographic dimension. The ion milling process may employ an ion beam I for removing the metal layer 104. The ion beam I may be incident on the metal layer 104 at an angle $\alpha$ with respect to sidewalls of the first opening 108. A portion of the ion beam I may be blocked by portions of the first mask 106 adjacent to the sidewalls of the first opening 108. In an implementation, the lateral extent of the ion beam may be limited by a first portion 106a of the first mask 106 at a top surface adjacent to the opening 108, and by a second portion 106b at a bottom of a sidewall of the opening 108 where the sidewall 108 meets the metal layer pattern 112. The angle $\alpha$ may be adjusted, and a first nanogap 110 having a desired size or a desired shape may be formed by adjusting the angle $\alpha$, and/or adjusting a width, height or sidewall profile of the opening 108.

Figure 5:
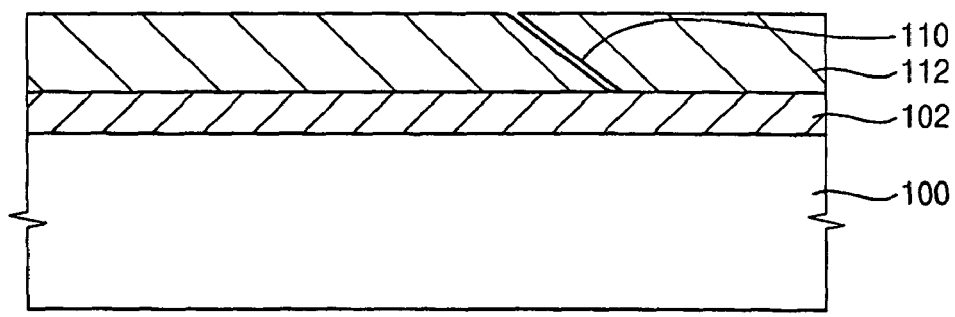

In an implementation, the angle $\alpha$ with respect to the sidewall of the first opening 108 has a value of about 30° to about 50°. In an implementation, the ion beam I may have an angle $\beta$ with respect to the horizontal top surface of the first mask of about 60° to about 40°. Thus, the metal layer pattern 112 may be formed with the first nanogap 110 being angled with respect to the top surface of the metal layer pattern 112. Sidewalls of the nanogap 110 may be parallel to the ion beam I. Referring to FIG. 5, the first mask 106 may be removed after formation of the nanogap 110 to expose the metal layer pattern 112 having the nanogap 110.

Materials and processing parameters that may be used for the forming mask layer and the metal pattern layer, and for ion milling of the metal pattern layer, are described in U.S. Pat. No. 7,056,446, the entire disclosure of which is hereby incorporated by reference for all purposes.

Embodiment 2

Figure 6:
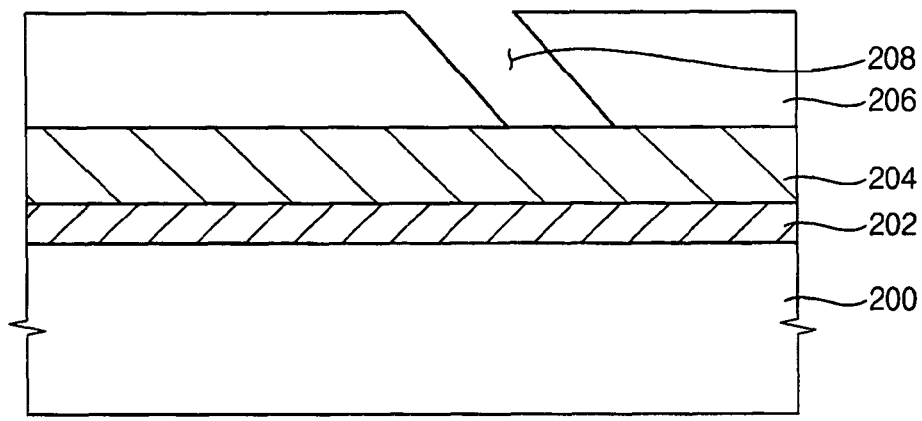
FIGS. 6 and 7 illustrate cross-sectional views of stages in a method of forming a metal layer having a nanogap in accordance with a second example embodiment.
Figure 7:
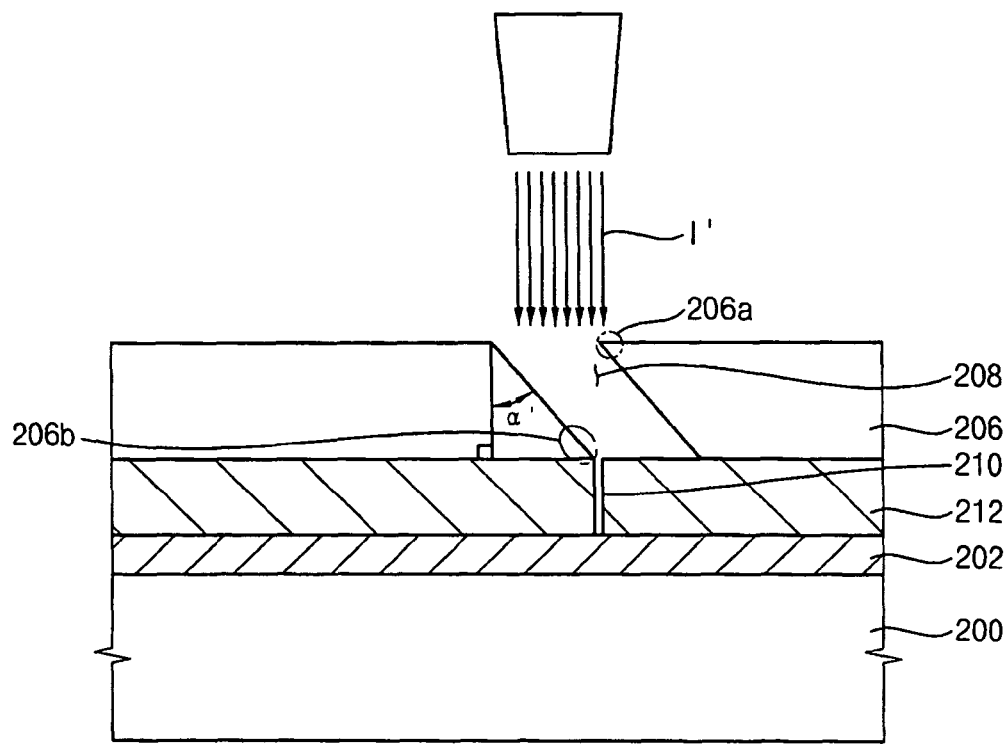

FIGS. 6 and 7 illustrate cross-sectional views of stages in a method of forming a metal layer having a nanogap for a molecule-sized device or a biosensor in accordance with a second example embodiment. Referring to FIG. 6, an insulation layer 202 and a metal layer 204 may be sequentially formed on a substrate 200. A third mask 206 having an opening 208 may be formed on the metal layer 204. The opening 208 may have sidewalls that are angled with respect to a top surface of the metal layer 204.

The insulation layer 202 may be formed from, e.g., silicon oxide, SOG, silicon nitride, silicon oxynitride, or high-k dielectric material such as $Al_2O_3$, $Hf_2O_3$, etc. The metal layer 204 may be formed from a conductive material such as a metal, a metal alloy, etc. The metal layer 204 may be formed from a metal having a work function that is suitable for a channel in a molecule-sized device. Also, the metal layer 204 may be formed from a metal having good adhesion to biological material to be detected when the metal layer 204 is used as part of a biosensor. For example, the metal layer 204 may be formed from gold (Au), platinum (Pt), or an alloy of these materials.

The third mask 206 may be formed as follows. A third mask layer (not shown) may be formed on the metal layer 204, and may have a sufficient thickness so that the third mask layer is not overetched by a subsequent ion milling process. A fourth mask layer (not shown) may be formed from a material having a high etching selectivity with respect to the third mask layer. A photoresist pattern (not shown) may be formed on the fourth mask layer, and may have features patterned at lithographic dimensions. The fourth mask layer may be partially removed by an etching process using the photoresist pattern as an etching mask, so that a fourth mask may be formed. The third mask layer may be patterned, i.e., partially removed, using an etching process with the fourth mask serving as an etching mask so as to form the third mask 206 having the second opening 208. The second opening 208 may be formed such that its sidewalls are angled with respect to the top surface of the metal layer 204.

An angle $\alpha'$ of the sidewalls of the second opening 208 may be, e.g., about 30° to about 50° from the vertical. The angle $\alpha'$ of the sidewalls may affect the ion-beam resistance of an acute aspect of a region 206a of the third mask 206. Accordingly, the angle $\alpha'$ may be made greater than about 50° or less than about 30°, depending on the resistance of the third mask 206 to the ion beam. The fourth mask may then be removed.

Referring to FIG. 7, an ion milling process may be performed in which an ion beam I' for removing the metal layer 204 is incident on the metal layer 204 at the angle $\alpha'$ with respect to the sidewalls of the second opening 208. The region 206a at the upper surface of the third mask 206, and a region 206b at a bottom sidewall of the opening 208, may limit the ion beam I'. Depending on the width of the ion beam I', the ion beam I' may be partially blocked by the regions 206a and 206b of the third mask 206 adjacent to the second opening 208. The angle $\alpha'$ of the ion beam with respect to the sidewalls of the second opening 208 may be adjusted.

A second nanogap 210 having a desired width and/or shape may be formed by adjusting the angle $\alpha'$ and/or the width, height or sidewall profile of the second opening 208. In an implementation, the ion beam I' may be perpendicularly incident on the metal layer 204, and may be incident on the exposed sidewall of the second opening 208 at angle of about 30° to about 50° with respect to the sidewall. Thus, the metal layer pattern 212 having the second nanogap 210 that is perpendicular to the top surface of the metal layer 212 may be formed. The metal layer pattern 212 having the second nanogap 210 may then be exposed by removing the third mask 206.

As described in the first and second embodiments above, a metal layer pattern having a nanogap of a desired size and/or shape may be formed by partially blocking an ion beam from being incident on the metal layer. Limiting the ion beam may include adjusting an angle of the ion beam. Additionally, the size of the nanogap may be adjusted to correspond to a size of a detected material by adjusting the angle of a sidewall and/or width of an opening in a mask with respect to a top surface of the metal layer pattern.

Method of Manufacturing a Molecule-Sized Device

Embodiment 3

Figure 8:
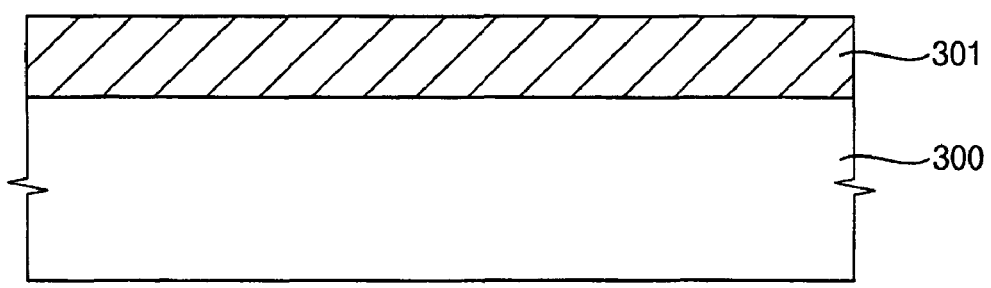
FIGS. 8 to 11 illustrate cross-sectional views of stages in a method of manufacturing a molecule-sized device or a biosensor in accordance with a third example embodiment.

FIGS. 8 to 11 illustrate cross-sectional views of stages in a method of manufacturing a molecule-sized device or a biosensor in accordance with a third example embodiment. Referring to FIG. 8, a gate electrode 301 may be formed on a substrate 300. In an implementation, the gate electrode 301 may be formed by forming a mask (not shown) on the substrate 300, and implanting or diffusing ions through the mask into the substrate 300. In another implementation, the gate electrode 301 may be formed by forming a conductive layer on the substrate 300 and partially etching, i.e., patterning, the conductive layer.

Figure 9:
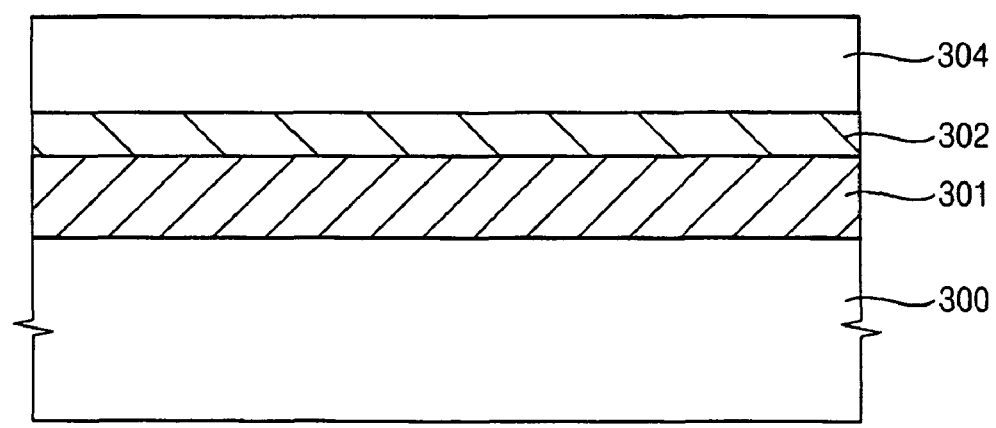

Referring to FIG. 9, an insulation layer 302 and a metal layer 304 may be sequentially formed on the gate electrode 301. The insulation layer 302 may be formed from, e.g., silicon oxide, SOG, silicon nitride, or a high-k material such as $Al_2O_3$, $Hf_2O_3$, etc. The metal layer 304 may be formed from a conductive material, e.g., a metal, a metal alloy, etc. The metal layer 304 may be formed from a metal having a work function that is suitable for a channel in a molecule-sized device. Also, the metal layer 304 may be formed from a metal having good adhesion to biological material that is to be detected when the metal layer 304 is used as part of a biosensor. For example, the metal layer 304 may be formed from gold (Au), platinum (Pt), or an alloy of these materials.

Figure 10:
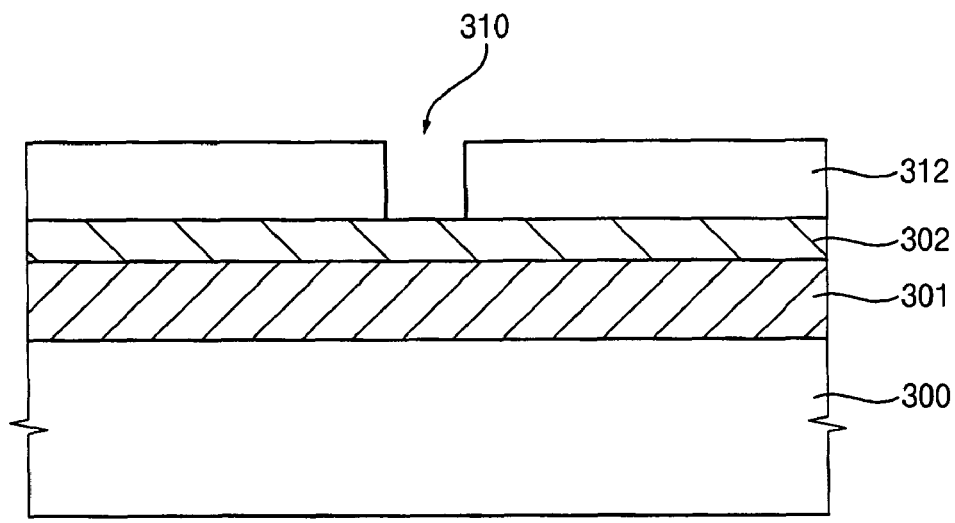

Referring to FIG. 10, a third nanogap 310 may be formed in the metal layer 304. The third nanogap 310 may be formed in accordance with, e.g., the second embodiment, so that a metal layer pattern 312 having the third nanogap 310 perpendicular to a top surface of the metal layer pattern 312 is formed on the insulation layer 302.

Formation of the third nanogap 310 may include forming a fifth mask (not shown) on the metal layer 304, the fifth mask having a third opening angled with respect to the top surface of the metal layer 304. The metal layer pattern 312 may be formed by an ion milling process in which an ion beam for removing the metal layer 304 is incident on the metal layer 304 at an angle with respect to a sidewall of the third opening so that a portion of the ion beam is blocked by portions of the fifth mask adjacent to the sidewall of the third opening. The width of the resultant third nanogap 310 may be controlled by controlling the portion of the metal layer 304 that is removed by the ion milling process, e.g., by adjusting the angle of the sidewall and/or width of the third opening with respect to the top surface of the metal layer 304. In an implementation, the angle of the sidewall of the third opening with respect to the top surface of the metal layer 304 may be about 30° to about 50°, and the ion beam may be incident on the metal layer 304 at a right angle with respect to the top surface of the metal layer 304. Thus, the metal layer pattern 312 may be formed with the third nanogap 310 of a desired size having sidewalls perpendicular to the top surface of the metal layer 304. After forming the metal layer pattern 312, the fifth mask may be removed to expose the metal pattern 312.

Figure 11:
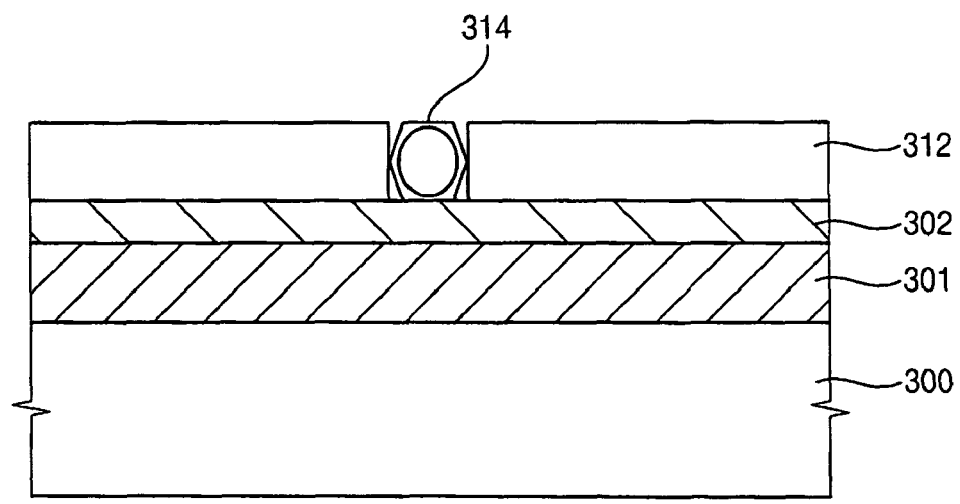

Referring to FIG. 11, a conductive molecular material 314 that serves as a channel may be adsorbed in the third nanogap 310 of the metal layer pattern 312. The third nanogap 310 may have substantially the same size as that of the conductive molecular material 314, and the conductive molecular material 314 may be a single layer. The conductive molecular material 314 may be adsorbed into the third nanogap 310 by, e.g., dipping the substrate 300 into a vessel containing a solution including conductive organic molecules dissolved therein. The conductive molecular material 314 may include conductive organic molecules such as those of biphenyl thiols or a Langmuir-Blodgett film. In an implementation, the conductive molecular material 314 may be adsorbed into the third nanogap 310 by a self-assembly phenomenon without applying any electric field to the third nanogap 310. Alternatively, the conductive molecular material 314 may be adsorbed by applying an electric field to the third nanogap 310. The conductive organic molecules may be vertically arranged to the substrate 300 in the third nanogap 310.

The molecule-sized device or the biosensor may have electrical characteristics, such as diode characteristics or a quantum effect, which depend on the type of conductive organic molecule. The molecule-sized device or the biosensor may be applied to a memory device, a logic device, an analog circuit device, etc.

As described above, the third nanogap 310 may be easily formed by forming the fifth mask and by performing the ion milling process, and the molecule-sized device may be easily manufactured. Additionally, the metal layer pattern 312 may be formed from various kinds of metals such as gold (Au), silver (Ag), platinum (Pt), or an alloy of these materials, which have various work functions suitable for a channel in the molecule-sized device. Furthermore, the molecule-sized device may serve as a biosensor for detecting biological material by putting a solution having conductive organic molecules into contact with the third nanogap 310.

Embodiment 4

Figure 12:
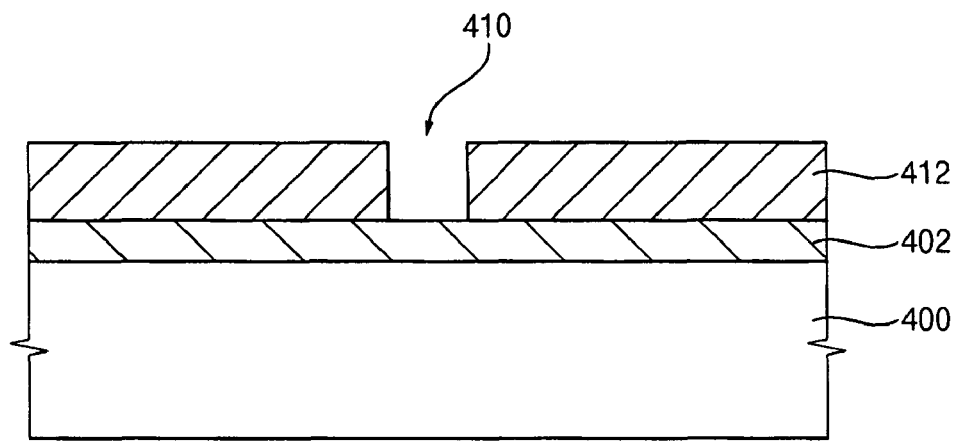
FIGS. 12 to 14 illustrate cross-sectional views of stages in a method of manufacturing a molecule-sized device or a biosensor in accordance with a fourth example embodiment.
Figure 13:
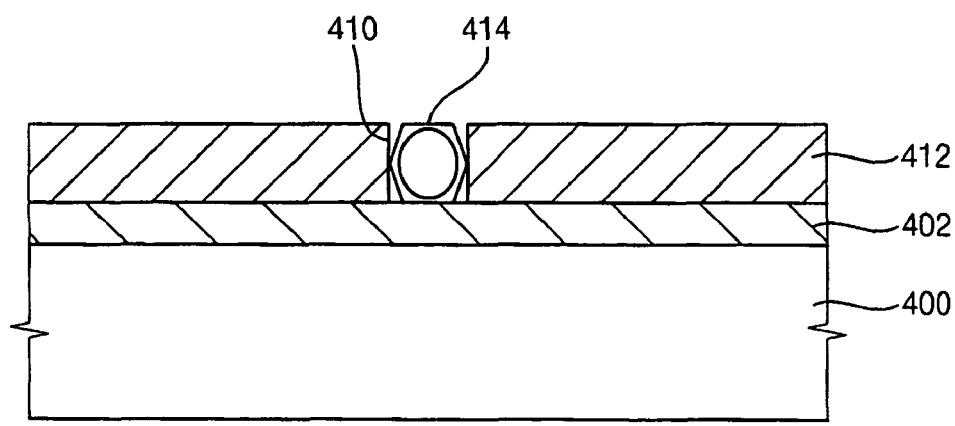
Figure 14:
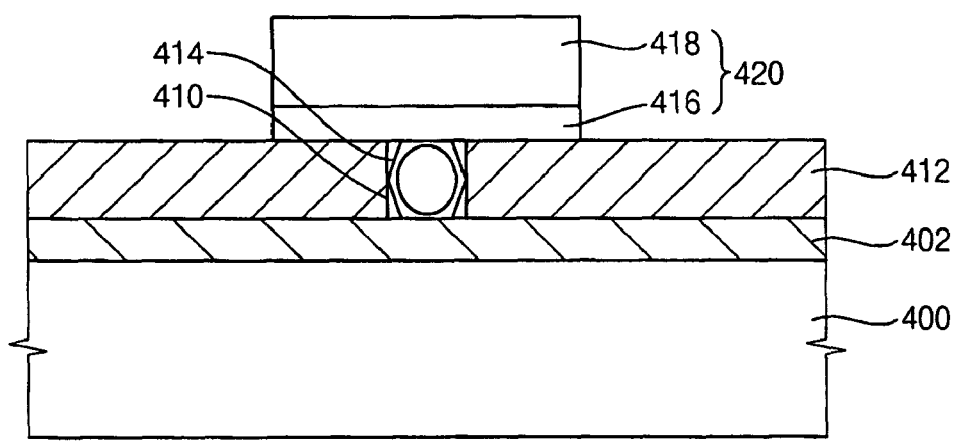

FIGS. 12 to 14 illustrate cross-sectional views of stages in a method of manufacturing a molecule-sized device or a biosensor in accordance with a fourth example embodiment. Referring to FIG. 12, an insulation layer 402 may be formed on a substrate 400, e.g., in accordance with the second embodiment, and a metal layer pattern 412 having a fourth nanogap 410 may be formed on the insulation layer 402 by an ion milling process using a sixth mask (not shown).

Forming the metal pattern 412 and the fourth nanogap 410 may include forming the sixth mask with a fourth opening angled with respect to a top surface of a metal layer. The metal layer pattern 412 may be formed by an ion milling process in which an ion beam for selectively removing the metal layer is incident on the metal layer at an angle with respect to a sidewall of the fourth opening. A portion of the ion beam may be blocked by some of the sixth mask adjacent to the sidewall of the fourth opening.

The portion of the metal layer that is removed by the ion milling process may be changed by adjusting the angle of the sidewall of the fourth opening with respect to the top surface of the metal layer. In an implementation, the angle of the sidewall of the fourth opening with respect to the top surface of the metal layer may be about 30° to about 50°, and the ion beam may be incident on the metal layer at a right angle with respect to the top surface of the metal layer. Thus, the metal layer pattern 412 may be formed with the fourth nanogap 410 of a predetermined width having sidewalls perpendicular to the top surface of the metal layer pattern 412. After forming the metal layer pattern 412, the sixth mask may be removed to expose the metal layer pattern 412.

Referring to FIG. 13, a conductive molecular material 414 that serves as a channel may be adsorbed in the fourth nanogap 410 of the metal layer pattern 412. The fourth nanogap 410 may have substantially the same size as that of the conductive molecular material 414. The conductive molecular material 414 may be a single layer. The conductive molecular material 414 may be adsorbed into the fourth nanogap 410 by, e.g., dipping the substrate 400 into a vessel containing a solution including conductive organic molecules dissolved therein. The conductive molecular material 414 may include conductive organic molecules such as biphenyl thiols or a Langmuir-Blodgett film. The molecule-sized device or the biosensor may have electrical characteristics, such as diode characteristics or a quantum effect, which depend on the type of the conductive organic molecule. In an implementation, the conductive molecular material 414 is adsorbed into the third nanogap 410 by a self-assembly phenomenon without applying any electric field to the third nanogap 410. Alternatively, the conductive molecular material 414 may be adsorbed by applying an electric field to the third nanogap 410. The conductive organic molecules may be vertically arranged to the substrate 400 in the fourth nanogap 410.

Referring to FIG. 14, a gate electrode structure 420 is formed on the metal layer pattern 412 and the fourth nanogap 410 having the conductive molecular material 414 therein. Forming the gate electrode structure 420 may include forming a gate insulation layer on the metal layer pattern 412 and the fourth nanogap 410 having the conductive molecular material 414 therein. A gate conductive layer may be formed on the gate insulation layer, after which the gate conductive layer and the gate insulation layer may be partially removed, i.e., patterned. Patterning may employ, e.g., an etching process, and may form a gate electrode 418 and a gate insulation layer pattern 416 of the gate electrode structure 420.

As described above, the fourth nanogap 410 may be easily formed by forming the sixth mask and by performing the ion milling process, so that the molecule-sized device may be easily manufactured. The metal layer pattern 412 may be formed from various kinds of metals such as gold (Au), silver (Ag), platinum (Pt), or an alloy of these materials, which have various work functions suitable for a channel in the molecule-sized device. The molecule-sized device may serve as a biosensor for detecting biological material by putting a solution having conductive organic molecules into the fourth nanogap 410.

As described herein, after forming a mask having an opening on a metal layer, an ion milling process may be performed to form a nanogap. An ion beam may incident on the metal layer at an angle to a sidewall of the opening. The angle of the ion beam with respect to the sidewall of the opening and/or upper surface of the metal layer may be adjusted, the sidewall of the opening may have various angles with respect to a top surface of the metal layer, and the width and/or height of the opening may be controlled to form a nanogap having a desired and shape. Accordingly, a nanogap may be formed in a reproducible manner. A molecule-sized device having a desired a gate length may be easily manufactured by forming a metal layer pattern having a nanogap, and the molecule-sized device may serve as a biosensor for detecting biological material by putting a solution having conductive organic molecules into contact with the nanogap.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A method of patterning a metal layer, comprising:
   forming a first mask on a surface of the metal layer, the first mask having an opening through the first mask that exposes the metal layer; and
   forming a nanogap in the exposed metal layer using an ion beam directed through the opening, wherein:
   the first mask limits a lateral extent of the ion beam,
   the nanogap has a width that is less than a width of the opening,
   a first lateral extent of the nanogap is defined by using a top surface of the first mask adjacent to the opening to limit a first lateral portion of the ion beam,
   a second lateral extent of the nanogap is defined by using a bottom sidewall of the opening to limit a second lateral portion of the ion beam,
   a sidewall of the opening is angled such that the top surface of the first mask, adjacent to the opening, overhangs the opening and
   the ion beam is vertically incident on the top surface of the first mask.

2. The method as claimed in claim 1, wherein forming the first mask on the surface of the metal layer includes:
   sequentially forming a first mask layer and a second mask layer on the metal layer;
   forming a second mask on the first mask layer using a photolithography process to pattern the second mask layer; and
   forming the first mask on the metal layer using an etching process to pattern the first mask layer, the second mask serving as an etching mask.

3. The method as claimed in claim 2, wherein the etching process includes a high-density plasma etching process, a reactive ion etching process, or a wet etching process.

4. The method as claimed in claim 1, wherein the first lateral extent of the nanogap corresponds to a first sidewall of the nanogap, and the second lateral extent of the nanogap corresponds to a second sidewall of the nanogap, the second sidewall of the nanogap being substantially parallel to the first sidewall.

5. The method as claimed in claim 4, wherein the first and second sidewalls of the nanogap are angled at a non-90° angle relative to the surface of the metal layer.

6. The method as claimed in claim 5, wherein opposing sidewalls of the opening are straight and parallel from the surface of the metal layer to the top surface of the first mask.

7. The method as claimed in claim 1, wherein the width of the opening, at an uppermost extent of the opening, is greater than the width of the nanogap.

8. A method of manufacturing a molecule-sized device, comprising:
   forming a first mask on a surface of a metal layer, the first mask having an opening through the first mask that exposes the metal layer;
   forming a nanogap in the exposed metal layer using an ion beam directed through the opening; and
   forming a gate electrode adjacent to the metal layer, the gate electrode being spaced apart from the metal layer by an insulation layer, wherein:
   the first mask limits a lateral extent of the ion beam,
   the nanogap has a width that is less than a width of the opening, a first lateral extent of the nanogap is defined by using a top surface of the first mask adjacent to the opening to limit a first lateral portion of the ion beam, a second lateral extent of the nanogap is defined by using a bottom sidewall of the opening to limit a second lateral portion of the ion beam, a sidewall of the opening is angled such that the top surface of the first mask, adjacent to the opening, overhangs the opening and the ion beam is vertically incident on the top surface of the first mask.

9. The method as claimed in claim 8, further comprising adsorbing a conductive molecular material into the nanogap.

10. The method as claimed in claim 9, wherein:
the gate electrode is formed on a substrate, and
the gate electrode is formed between the metal layer and the substrate.

11. The method as claimed in claim 9, wherein:
the metal layer is formed on a substrate, and
the metal layer is formed between the gate electrode and the substrate.

12. The method as claimed in claim 8, wherein forming the first mask on the surface of the metal layer includes:
sequentially forming a first mask layer and a second mask layer on the metal layer;
forming a second mask on the first mask layer using a photolithography process to pattern the second mask layer; and
forming the first mask on the metal layer using an etching process to pattern the first mask layer, the second mask serving as an etching mask.

* * * * *